United States Patent [19]
Liao

[11] Patent Number: 5,637,190
[45] Date of Patent: Jun. 10, 1997

[54] PLASMA PURGE METHOD FOR PLASMA PROCESS PARTICLE CONTROL

[75] Inventor: Chih-Cherng Liao, Hsinchu, Taiwan

[73] Assignee: Vanguard International Semiconductor Corporation, Hsinchu, Taiwan

[21] Appl. No.: 529,013

[22] Filed: Sep. 15, 1995

[51] Int. Cl.$^6$ ................................................ H01L 21/311
[52] U.S. Cl. .................... 438/726; 134/1.2; 438/905; 438/758; 438/788; 438/792; 216/67
[58] Field of Search ................ 156/643.1, 646.1, 156/662.1, 651.1, 653.1; 134/1.1, 1.2; 216/79

[56] References Cited

U.S. PATENT DOCUMENTS

| | | | |
|---|---|---|---|
| 4,351,696 | 9/1982 | Radegan | 156/643.1 |
| 4,750,980 | 6/1988 | Hynecek | 437/225 |
| 4,923,828 | 5/1990 | Gluck | 156/643.1 |
| 4,992,137 | 2/1991 | Cathey et al. | 156/643.1 |
| 5,059,278 | 10/1991 | Cohen et al. | 216/95 |
| 5,271,799 | 12/1993 | Langley | 156/643.1 |
| 5,328,555 | 7/1994 | Gupta | 156/643.1 |
| 5,387,777 | 2/1995 | Bennett et al. | 156/345 |
| 5,403,780 | 4/1995 | Jain et al. | 437/195 |
| 5,423,918 | 6/1995 | Gupta et al. | 134/1 |

FOREIGN PATENT DOCUMENTS

| | | |
|---|---|---|
| 03044472 | 2/1991 | Japan. |
| 03161927 | 7/1991 | Japan. |

OTHER PUBLICATIONS

"Dual–Function Remote Plasma Etching/Cleaning System Applied To Selective Etching of SiO$_2$, and Removal of Polymeric Residues"; J. Vac. Sci. Tech. A., Vac. Surf. Films; vol. 11, No. 5; pp. 2,496–2,507; Sep.–Oct. 1993; Yasuda et al.

*Primary Examiner*—R. Bruce Breneman
*Assistant Examiner*—George Goudreau
*Attorney, Agent, or Firm*—George O. Saile; Alek P. Szecsy

[57] ABSTRACT

A method for limiting contaminant particle deposition upon integrated circuit layers within plasma assisted process reactor chambers. First, a plasma assisted process is undertaken upon an integrated circuit layer within a plasma assisted process reactor chamber. The plasma assisted process employs a first reactant gas composition, a first radio frequency power and a first reactor chamber pressure appropriate to the plasma assisted process and the integrated circuit layer. Immediately following the plasma assisted process is undertaken a first plasma purge step. The first plasma purge step employs a first concentration of an oxidizing reactant gas, a first concentration of a non-oxidizing reactant gas, a second radio frequency power and a second reactor chamber pressure. The second radio frequency power is lower than the first radio frequency power and the second reactor chamber pressure is higher than the first reactor chamber pressure. Finally, there is undertaken immediately following the first plasma purge step a second plasma purge step. The second plasma purge step employs a second concentration of the oxidizing reactant gas, a second concentration of the non-oxidizing reactant gas, a third radio frequency power and a third reactor chamber pressure. The third radio frequency power is less than the second radio frequency power, and the third reactor chamber pressure is lower than the second reactor chamber pressure.

21 Claims, 1 Drawing Sheet

PLASMA PURGE METHOD FOR PLASMA PROCESS PARTICLE CONTROL

BACKGROUND OF THE INVENTION

1. Field of the Invention

The present invention relates generally to plasma assisted methods for processing integrated circuit layers. More particularly, the present invention relates to plasma assisted methods for processing integrated circuit layers, which plasma assisted methods provide limited contaminant particle deposition upon those integrated circuit layers.

2. Description of the Related Art

Well known in the art of integrated circuit manufacture is the use of radio frequency excitation to produce reactive and non-reactive plasmas which assist in processing integrated circuit layers. The plasmas which assist in processing integrated circuit layers may be directed towards several aspects of integrated circuit layer fabrication. Plasmas may be employed to assist in integrated circuit layer fabrication processes including but not limited to integrated circuit layer formation processes, integrated circuit layer removal processes and integrated circuit layer modification processes. The types of integrated circuit layers whose processing may be assisted through the use of radio frequency plasmas include but are not limited to conductor layers, insulator layers, semiconductor layers and photo-active layers.

Although the use radio frequency excitation to produce plasmas which have applications within virtually every aspect of integrated circuit layer fabrication have become quite common in the art, such plasmas are not without problems. In particular, one of the more troubling problems resulting from plasma assisted processing of integrated circuit layers is the formation of contaminant particles within plasma assisted process reactor chambers and the deposition of those contaminant particles upon the surfaces of integrated circuit layers which are processed by plasmas contained within those chambers. The contaminant particles may be generated from several sources, including but not limited to the materials from which is formed the plasma and the materials from which is formed the reactor chamber within which is contained the plasma. When deposited upon the integrated circuit layers for whose processing the plasma is intended, the particles resulting from these materials assist in forming defects which impede production of fully functional and reliable integrated circuits.

Several aspects of the dynamics of contaminant particle formation and deposition within radio frequency plasma assisted integrated circuit layer fabrication processes and process reactor chambers are known in the art. For example, it is known that plasma induced electrostatic forces are likely to play significant roles in contaminant particle deposition upon integrated circuit layers exposed to a plasma within a plasma process reactor chamber. Alternatively, it is also known that non-electrostatic forces, such as temperature gradient forces, fluid dynamic drag forces and gravitational forces are likely to play more significant roles in contaminant particle deposition upon integrated circuit layers within process reactor chambers where a radio frequency plasma is absent. It is thus towards the control of contaminant particles within radio frequency plasma assisted integrated circuit layer processing chambers through methods that derive from an understanding of particle formation and deposition dynamics within those chambers that the present invention is directed.

Methods through which various features of plasma assisted integrated circuit layer processing methods may be influenced through understanding of the technical principles upon which those processes are based are known in the art. For example, Jain et al., in U.S. Pat. 5,403,780 describe a method for enhancing the planarization etch-back profile, the stability and the reliability of silicon oxide insulator layers formed through plasma assisted etching processes. The disclosed method employs a composite silicon oxide insulator layer, portions of which are formed with a silicon content tailored to provide the desired planarization, stability and reliability characteristics of the composite silicon oxide insulator layer.

Desirable in the art are methods whereby a fundamental understanding of particle generation and deposition phenomena are analogously employed in defining plasma assisted processes through which contaminant particulate deposition upon integrated circuit layers within plasma assisted process reactor chambers is limited. Highly desirable is methodology which is generally applicable to a wide variety of plasma assisted processes and plasma assisted process reactor chambers.

SUMMARY OF THE INVENTION

A first object of the present invention is to provide a method for limiting contaminant particle deposition upon integrated circuit layers within plasma assisted process reactor chambers, the method so provided being generally applicable to a wide variety of plasma assisted processes and plasma assisted process reactor chambers.

A second object of the present invention is to provide a method in accord with the foregoing object of the present invention, which method is also manufacturable.

A third object of the present invention is to provide a method in accord with the foregoing objects of the present invention, which method is also economical.

In accord with the objects of the present invention, a method for limiting contaminant particle deposition upon integrated circuit layers within plasma assisted process reactor chambers is disclosed. To practice the present invention, there is first undertaken a plasma assisted process upon an integrated circuit layer within a plasma assisted process reactor chamber. The plasma assisted process employs a first reactant gas composition, a first radio frequency power and a first reactor chamber pressure appropriate to the plasma assisted process and the integrated circuit layer. Immediately following the plasma assisted process there is undertaken a first plasma purge step for a first purge time. The first plasma purge step employs a first concentration of an oxidizing reactant gas, a first concentration of a non-oxidizing reactant gas, a second radio frequency power and a second reactor chamber pressure. The second radio frequency power is lower than the first radio frequency power and the second reactor chamber pressure is higher than the first reactor chamber pressure. Finally, immediately following the first plasma purge step there is undertaken a second plasma purge step for a second purge time. The second plasma purge step employs a second concentration of the oxidizing reactant gas, a second concentration of the non-oxidizing reactant gas, a third radio frequency power and a third reactor chamber pressure. The third radio frequency power is less than the second radio frequency power, and the third reactor chamber pressure is lower than the second reactor chamber pressure.

The method of the present invention limits contaminant particle deposition upon integrated circuit layers within plasma assisted process reactor chambers. The method is also generally applicable to a wide variety of plasma assisted processes and plasma assisted process reactor chambers.

The method of the present invention provides for two successive plasma purge process steps immediately following a plasma assisted process undertaken upon an integrated circuit layer within a plasma assisted process reactor chamber. The plasma assisted process employs a first reactant gas composition, a first radio frequency power and a first reactor chamber pressure appropriate to the plasma assisted process and the integrated circuit layer. Immediately following the plasma assisted process there is undertaken a first purge step which employs a first concentration of an oxidizing reactant gas, a first concentration of a non-oxidizing reactant gas, a second radio frequency power and a second reactor chamber pressure. The second radio frequency power is lower than the first radio frequency power and the second reactor chamber pressure is higher than the first reactor chamber pressure.

Within the first plasma purge step, the purpose of the oxidizing reactant gas and the non-oxidizing reactant gas is to chemically and physically etch any particles that remain within the plasma reactor chamber from the plasma assisted process. In addition, the lowering the radio frequency power within the plasma reactor chamber through the first plasma purge step provides a particle density within the plasma, which density is concentrated at locations remote from the integrated circuit layer surface. Finally, by increasing the pressure within the reactor chamber through the first plasma purge step, the concentration of particles per mole of the oxidizing reactant gas and the non-oxidizing reactant gas mixture will be diluted.

Within the second plasma purge step, the purpose of the oxidizing reactant gas and the non-oxidizing reactant gas is to continue to chemically and physically etch any particles that continue to remain in the reactor chamber from the first plasma purge step. In addition, the continued lowering of the radio frequency power within the second plasma purge step provides a continued polarization of remaining particles away from the surface of the integrated circuit layer. Finally, by re-lowering the reactor chamber pressure within the second purge step, a substantial volume of oxidizing reactant gas and non-oxidizing reactant gas is removed from the reactor chamber taking along with it particles which are entrained within those gasses.

Resulting from this two-step plasma purge process is fewer particles within the plasma reactor chamber. In addition, the fewer remaining particles are remotely located from integrated circuit layer surfaces. Thus, integrated circuit layers which have been processed with plasma assisted processes, which plasma assisted processes have been followed the two-step plasma purge process of the present invention, exhibit less surface contaminant particulate than integrated circuit layers analogously processed without the benefit of the two-step plasma purge process of the present invention.

Since the two-step plasma purge process of the present invention involves only changes in plasma reactor gasses, radio frequency plasma power and reactor chamber pressure, which changes are common in the art, the two-step plasma purge process of the present invention is readily manufacturable. For analogous reasons pertaining specifically to manufacturability concerns, the two-step plasma purge process of the present invention is also economical. For reasons which relate to cost savings associated with defect density reductions within integrated circuit layers processed through plasma assisted processes, the two-step plasma purge process of the present invention is particularly economical.

DESCRIPTION OF THE PREFERRED EMBODIMENTS

The present invention provides a method for limiting contaminant particle deposition upon integrated circuit layers within plasma assisted process reactor chambers. The method of the present invention incorporates a two-step plasma purge process immediately subsequent to a plasma assisted integrated circuit layer process which has been undertaken within a plasma assisted process reactor chamber. By means of adjusting the reactant gas composition, the radio frequency power and the reactor chamber pressure within the two-step plasma purge process which follows the plasma assisted integrated circuit layer process, fewer particles are deposited upon integrated circuit layers which have been exposed to the two-step plasma purge process of the present invention than equivalent integrated circuit layers which have not benefitted from the two-step plasma purge process of the present invention.

The two-step plasma purge process of the present invention may be employed immediately subsequent to plasma assisted integrated circuit layer processing of any integrated circuit layer wherein it is desired to limit contaminant particle deposition upon that integrated circuit layer. The two-step plasma purge process of the present invention may be employed following plasma assisted integrated circuit layer processing of integrated circuit layers which are formed into integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications field effect transistors, integrated circuits having within their fabrications bipolar transistors and integrated circuits having within their fabrications Bipolar-Complementary Metal Oxide Semiconductor (Bi-CMOS) transistors. The two-step plasma purge process of the present invention has broad applicability within integrated circuit layer processing.

Figure 1A:
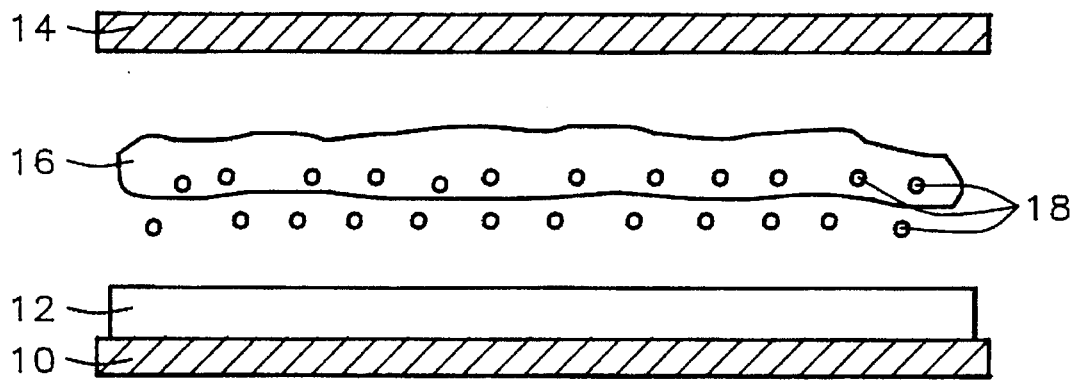
FIG. 1a to FIG. 1c illustrate the electrodes and plasma within a plasma process reactor chamber in accord with progressive stages of the two-step plasma purge process of the first preferred embodiment of the present invention.
Figure 1B:
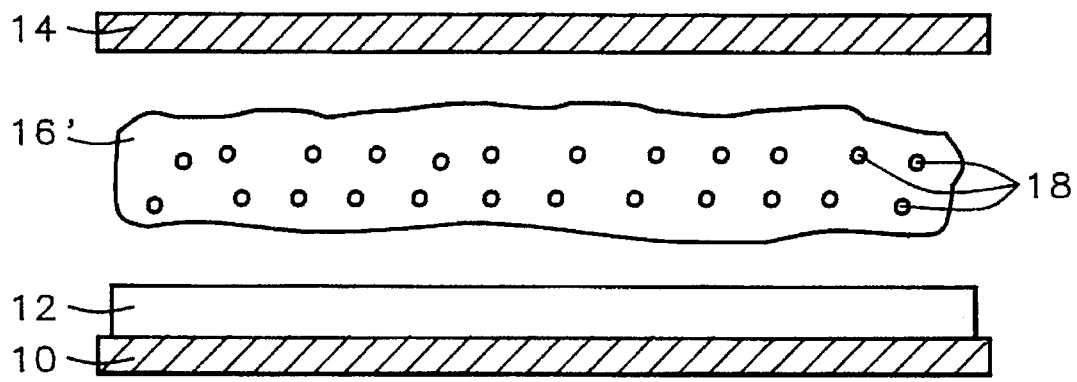
Figure 1C:
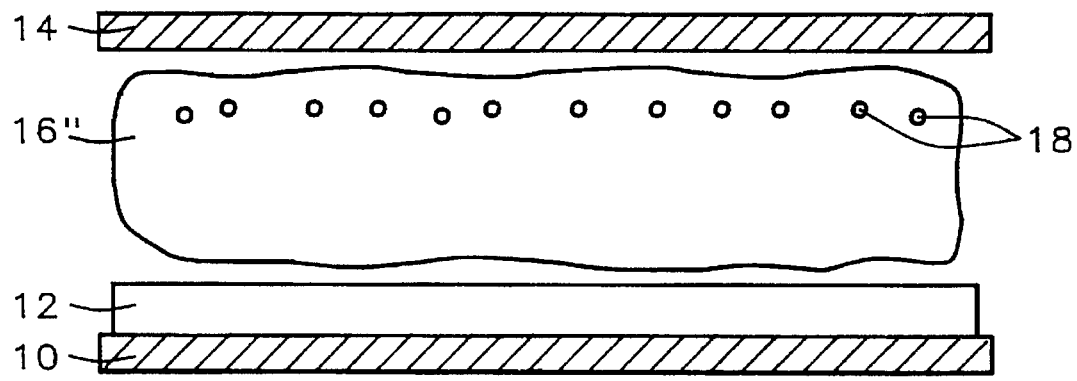

Referring now to FIG. 1a to FIG. 1c there is shown a series of cross-sectional schematic diagrams illustrating the electrodes and plasma within a plasma process reactor chamber at progressive process stages in practicing the two-step plasma purge process of the first preferred embodiment of the present invention. The diagrams shown in FIG. 1a to FIG. 1c are illustrative of a general application of the two-step plasma purge process of the present invention. The general application of the two-step plasma purge process of the present invention represents the first preferred embodiment of the present invention. Additional embodiments of the present invention will be described following the first preferred embodiment. The additional embodiments will include specific plasma assisted integrated circuit layer processes immediately preceding the two-step plasma purge process of the present invention.

Referring now to FIG. 1a there is shown a schematic cross-sectional diagram illustrating the electrodes and plasma within a plasma assisted process reactor chamber within which is formed a plasma for use in processing an integrated circuit layer (the plasma reactor chamber is not shown). Shown in FIG. 1a is an anode 10 upon which is placed a semiconductor substrate 12. Opposite the semiconductor substrate 12 is a cathode 14. Between the cathode 14 and the semiconductor substrate 12 is formed a plasma 16. The plasma 16 is used in processing an integrated circuit layer which resides upon the upper exposed surface of the semiconductor substrate 12. Also shown in FIG. 1a is the presence of particles 18 within and adjoining the plasma 16 near the surface of the semiconductor substrate 12 upon which resides the integrated circuit layer. As illustrated in FIG. 1a, the particles 18 are localized in a plane close to the surface of the integrated circuit layer which resides upon the semiconductor substrate 12. The presence of particles in this location is common in plasma assisted processes undertaken in the range of about 200 to about 950 watts radio frequency plasma power and about 200 to about 3000 mTorr reactor chamber pressure.

The plasma illustrated in the schematic cross-sectional diagram of FIG. 1a may be employed in a broad range of plasma assisted processes by which integrated circuit layers are processed. The plasma illustrated in the schematic cross-sectional diagram of FIG. 1a may be employed in plasma assisted processes including but not limited to plasma assisted integrated circuit layer formation processes, plasma assisted integrated circuit layer removal processes and plasma assisted integrated circuit layer modification processes. In addition, the integrated circuit layer which resides upon the semiconductor substrate 12 may include a broad range of integrated circuit layers which are conventionally processed through plasma assisted processes. The integrated circuit layer which resides upon semiconductor substrate 12 may include but is not limited to the group of integrated circuit layers consisting of integrated circuit conductor layers, integrated circuit insulator layers, integrated circuit semiconductor layers and integrated circuit photo-active layers.

In order to process the integrated circuit layer, the plasma 16 of the first preferred embodiment of the present invention employs a first reactant gas composition, a first radio frequency power and a first reactor chamber pressure appropriate to the plasma assisted process and the integrated circuit layer. Preferably, the first radio frequency power will be in the range of about 200 to about 950 watts. Preferably, the first reactor chamber pressure will be in the range of about 200 to about 3000 mTorr.

Referring now to FIG. 1b there is shown a schematic cross-sectional diagram illustrating the electrodes and plasma within a plasma reactor chamber in accord with the next process step of the first preferred embodiment of the present invention. Illustrated in FIG. 1b are the same features which are illustrated in FIG. 1a with the exception that the size of the plasma 16 in FIG. 1a has increased to encompass a plasma 16' in FIG. 1b. In addition, the plane encompassing the high concentration of particles 18 has moved further away from the surface of the semiconductor substrate 12 upon which resides the integrated circuit layer whose processing is assisted by the plasma 16. These changes in the size of the plasma 16 and the location of the particles 18 result from the first plasma purge step of the first preferred embodiment of the present invention.

The first plasma purge step is undertaken immediately following the plasma assisted process of the first preferred embodiment of the present invention. The first plasma purge step is undertaken for a first purge time of about 5 to about 15 seconds. The first plasma purge step employs a first concentration of an oxidizing reactant gas, a first concentration of a non-oxidizing reactant gas, a second radio frequency power and a second reactor chamber pressure. The second radio frequency power is lower than the first radio frequency power and the second reactor chamber pressure is higher than the first reactor chamber pressure.

Within the first plasma purge step, the purpose of the oxidizing reactant gas and the non-oxidizing reactant gas is to chemically and physically etch any particles 18 that remain within the reactor chamber from the plasma assisted process. In addition, by lowering the radio frequency power within the plasma reactor chamber through the first plasma purge step, the particle density within the plasma 16' concentrates at locations remote from the integrated circuit layer surface. Finally, by increasing the pressure within the plasma reactor chamber, the concentration of particles per mole of the oxidizing reactant gas and the non-oxidizing reactant gas mixture will be decreased.

Oxidizing reactant gasses and non-oxidizing reactant gases are known in the art of integrated circuit fabrication. Typically, oxidizing reactant gasses include but are not limited to oxygen, ozone, nitric oxide and nitrous oxide. Typically, non-oxidizing reactant gasses include but are not limited to argon, nitrogen and helium. For the first preferred embodiment of the present invention, the oxidizing reactant gas is preferably oxygen gas and the non-oxidizing reactant gas is preferably argon. These choices of oxidizing reactant gas oxygen and non-oxidizing reactant gas argon provide adequate performance and economy of the first plasma purge step of the two-step plasma purge process of the first preferred embodiment of the present invention. Other oxidizing reactant gasses and non-oxidizing reactant gasses may, however, be employed. Preferably the oxygen oxidizing reactant gas is employed at a first concentration of from about 80 to about 500 standard cubic centimeters per minute (sccm). Preferably, the argon non-oxidizing reactant gas is employed at a first concentration of from about 100 to about 500 standard cubic centimeters per minute (sccm).

With regard to the second radio frequency power and the second reactor chamber pressure which are employed in the first plasma purge step, it has been found experimentally that the second radio frequency power is preferably from about 25 to about 50 percent of the first radio frequency power employed in the plasma assisted process by which the integrated circuit layer is processed. Analogously, the second reactor chamber pressure is preferably from about 200 to about 400 percent of the first reactor chamber pressure employed in the plasma assisted process by which the integrated circuit layer is processed.

Referring now to FIG. 1c there is shown a schematic cross-sectional diagram illustrating the electrodes and plasma within a plasma reactor chamber in accord with the last process step of the first preferred embodiment of the present invention. Illustrated in FIG. 1c are the same features which are illustrated in FIG. 1b with the exception that the size of the plasma 16' in FIG. 1b has continued to increase to encompass plasma 16" in FIG. 1c. In addition, the plane encompassing the high concentration of particles 18 has continued to move further away from the surface of the semiconductor substrate 12 upon which resides the integrated circuit layer. Finally, the concentration of particles within the plasma reactor chamber has decreased. These changes in the size of the plasma 16', the location of the particles 18 and the number of the particles 18 result from the second plasma purge step of the first preferred embodiment of the present invention.

The second plasma purge step is undertaken immediately following the first plasma purge step, preferably for a second purge time of from about 5 to about 15 seconds. The second plasma purge step employs a second concentration of the oxidizing reactant gas, a second concentration of the non-oxidizing reactant gas, a third radio frequency power and a third reactor chamber pressure. The third radio frequency power is less than the second radio frequency power, and the third reactor chamber pressure is lower than the second reactor chamber pressure.

Within the second plasma purge step, the purpose of the oxidizing reactant gas and the non-oxidizing reactant gas is to continue to chemically and physically etch any particles that continue to remain in the reactor chamber after the first plasma purge step. In addition, the continued lowering of the radio frequency power from the first plasma purge step to the second plasma purge step provides a continued polarization of particles remaining in the plasma away from the surface of the integrated circuit layer. Finally, by re-lowering the reactor chamber pressure in progressing from the first plasma purge step to the second plasma purge step, a substantial volume of oxidizing reactant gas and non-oxidizing reactant gas is removed from the reactor chamber, taking along with it particles which are entrained within that volume of gasses.

The oxidizing reactant gas and the non-oxidizing reactant gas employed in the second plasma purge step are the same as the oxidizing reactant gas and the non-oxidizing reactant gas employed in the first plasma purge step. Specifically, the oxidizing reactant gas is preferably oxygen and the non-oxidizing reactant gas is preferably argon. The reasons for the choice of oxygen oxidizing reactant gas and argon non-oxidizing reactant gas are equivalent to those outlined for the first plasma purge step. Although it is not a requirement for the first preferred embodiment of the present invention, the second concentration of the oxygen oxidizing reactant gas and the second concentration of the argon non-oxidizing reactant gas are also preferably equivalent to the corresponding concentrations employed within the first plasma purge step. Preferably, the oxygen oxidizing reactant gas is employed at a second concentration of from about 80 to about 500 standard cubic centimeters per minute (sccm). Preferably, the argon non-oxidizing reactant gas is employed at a second concentration of from about 100 to about 500 standard cubic centimeters per minute (sccm).

With regard to the third radio frequency power and the third reactor chamber pressure which are employed in the second plasma purge step, it has been found experimentally that the third radio frequency power is preferably from about 20 to about 50 percent of the second radio frequency power which is employed in the first plasma purge step. Analogously, the third reactor chamber pressure is preferably no greater than about 50 percent of the second reactor chamber pressure employed in the first plasma purge step.

It is also known in the art that plasma processes, in general, may be accelerated or modified through the application of a magnetic field within those processes. The plasma assisted process, the first plasma purge step and the second plasma purge step of the first preferred embodiment of the present invention may optionally benefit from the application of such a magnetic field. There are several methods through which magnetic fields may be introduced into plasma reactor chambers, including but not limited to incorporation of magnets within the proximity of cathode and anode electrodes within plasma reactor chambers and generation of magnetic fields through means external to a plasma reactor chamber, such as Electron Cyclotron Resonance (ECR) means. For the first preferred embodiment of the present invention, a magnetic field is optionally present during the plasma assisted process, the first plasma purge step and the second plasma purge step. The magnetic field, if present, is preferably present at a strength of no greater than about 100 gauss.

Upon completing the second plasma purge step, the two-step plasma purge process of the first preferred embodiment of the present invention is completed. An integrated circuit layer processed through a plasma assisted process which has been followed by the two-step plasma purge process of the first preferred embodiment of the present invention will exhibit less surface contaminant particulate than an analogously processed integrated circuit layer which has not benefitted from the two-step plasma purge process of the first preferred embodiment of the present invention. Upon completing the two-step plasma purge process of the first preferred embodiment of the present invention, the semiconductor substrate 10 upon which resides the integrated circuit layer may either be removed from the plasma reactor chamber within which it resides or exposed to additional integrated circuit manufacturing processes within the plasma reactor chamber within which it resides.

In addition to the first preferred embodiment of the present invention, which embodiment is directed to a general application of the two-step plasma purge process of the present invention, there exist two additional embodiments of the present invention which are directed towards specific plasma assisted integrated circuit layer processing processes in association with the two-step plasma purge process of the present invention. The first additional embodiment is directed to the two-step plasma purge process of the present invention associated with a plasma assisted silicon oxide integrated circuit layer etch process. This embodiment represents the second preferred embodiment of the present invention. The second additional embodiment is directed to the plasma purge process of the present invention associated with a plasma assisted silicon oxide integrated circuit layer deposition process. This embodiment represents the third preferred embodiment of the present invention.

With regard to the second preferred embodiment of the present invention, plasma assisted silicon oxide integrated circuit layer etch processes are well known in the art. Such processes are normally undertaken in plasma assisted process reactor chambers at radio frequency powers and reactor chamber pressures within the range specified for the plasma assisted process of the first preferred embodiment of the present invention. In addition, methods by which silicon oxide integrated circuit layers may be formed upon semiconductor substrates are also conventional to the art. Thus, the second preferred embodiment of the present invention may be employed in etching silicon oxide integrated circuit layers including but not limited to silicon oxide integrated circuit layers which are formed through processes including but not limited to Chemical Vapor Deposition (CVD) processes, Plasma Enhanced Chemical Vapor Deposition (PECVD) processes, Spin-On-Glass (SOG) deposition processes and Physical Vapor Deposition (PVD) sputtering processes.

Thus, in order to practice the second preferred embodiment of the present invention, a silicon oxide integrated circuit layer is first formed upon a semiconductor substrate. The silicon oxide integrated circuit layer is then etched through a plasma assisted process. The plasma through which the silicon oxide integrated circuit layer is etched is then purged in accord with the two-step plasma purge process of the present invention.

For the second preferred embodiment of the present invention, the plasma assisted process by which the silicon oxide integrated circuit layer is etched preferably employs a first radio frequency power of about 600 to about 950 watts; a first reactor chamber pressure of about 200 to about 300 mTorr; a reactant gas composition of tri-fluoro-methane at about 10 to about 100 standard cubic centimeters per minute (sccm), carbon-tetra-fluoride at about 65 to about 95 standard cubic centimeters per minute (sccm) and argon at about 40 to about 80 standard cubic centimeters per minute; and a magnetic field strength of about 20 to about 100 gauss.

For the second preferred embodiment of the present invention, the first plasma purge step preferably employs a second radio frequency power of about 250 to about 350 watts, a second reactor chamber pressure of about 400 to about 900 mTorr, a first concentration of oxygen oxidizing reactant gas at about 80 to about 150 standard cubic centimeters per minute (sccm), a first concentration of argon non-oxidizing reactant gas at about 100 to about 200 standard cubic centimeters per minute (sccm) and a magnetic field strength of about 20 to about 100 gauss. Analogously, for the second preferred embodiment of the present invention, the second plasma purge step preferably employs a third radio frequency power of about 50 to about 150 watts, a third reactor chamber pressure no greater than about 200 mTorr, a second concentration of oxygen oxidizing reactant gas at about 80 to about 150 standard cubic centimeters per minute (sccm), a second concentration of argon non-oxidizing reactant gas at about 100 to about 200 standard cubic centimeters per minute (sccm) and a magnetic field strength of about 20 to about 100 gauss.

Upon plasma assisted etch processing and two-step plasma purging in accord with the second preferred embodiment of the present invention, there is formed an etched silicon oxide integrated circuit layer upon a semiconductor substrate, which etched silicon oxide integrated circuit layer has fewer contaminant particles deposited upon its surface than an equivalently etched silicon oxide integrated circuit layer which has not benefitted from exposure to the two-step plasma purge process of the second preferred embodiment of the present invention.

With regard to the third preferred embodiment of the present invention, plasma assisted processes by which silicon oxide integrated circuit layers may be deposited are also well known in the art. Such plasma assisted processes typically employ suitable silicon source reactant gases such as silane and Tetra Ethyl Ortho Silicate (TEOS). Either of these two silicon source reactant gasses may be employed in the third preferred embodiment of the present invention.

For the third preferred embodiment of the present invention, the plasma assisted process by which the silicon oxide integrated circuit layer is deposited from the silane or Tetra Ethyl Ortho Silicate (TEOS) silicon source reactant gasses preferably employs a first radio frequency power of about 200 to about 700 watts, a first reactor chamber pressure of about 500 to about 3000 mTorr and a silicon source reactant gas concentration at about 100 to about 600 standard cubic centimeters per minute (sccm). No magnetic field is typically employed in this process.

For the third preferred embodiment of the present invention, the first plasma purge step preferably employs a second radio frequency power of about 50 to about 300 watts, a second reactor chamber pressure of about 2000 to about 7000 mTorr, a first concentration of oxygen oxidizing reactant gas at about 100 to about 500 standard cubic centimeters per minute (sccm) and a first concentration of argon non-oxidizing reactant gas at about 100 to about 500 standard cubic centimeters per minute (sccm). Analogously, for the third preferred embodiment of the present invention, the second plasma purge step preferably employs a third radio frequency power of about 20 to about 150 watts, a reactor chamber pressure of no greater than about 500 mTorr, a second concentration of oxygen oxidizing reactant gas at about 100 to about 500 standard cubic centimeters per minute (sccm) and a second concentration of argon non-oxidizing reactant gas at about 100 to about 500 standard cubic centimeters per minute (sccm).

Upon plasma assisted silicon oxide integrated circuit layer deposition and two-step plasma purging in accord with the third preferred embodiment of the present invention, there is deposited a silicon oxide integrated circuit layer upon a semiconductor substrate, which silicon oxide integrated circuit layer has fewer contaminant particles deposited upon its surface than an equivalently deposited silicon oxide integrated circuit layer which has not benefitted from exposure to the two-step plasma purge process of the third preferred embodiment of the present invention.

EXAMPLES

Two series of semiconductor substrate wafers had formed upon their surfaces silicon oxide integrated circuit layers. The silicon oxide integrated circuit layers were formed through either Spin-On-Glass silicon oxide integrated circuit layer processes or Plasma Enhanced Chemical Vapor Deposited (PECVD) silicon oxide integrated circuit layer processes through methods and materials as are conventional in the art.

The surfaces of all of the silicon oxide integrated circuit layers were measured through techniques as are conventional in the art to determine the level of surface contaminant particulate. The silicon oxide integrated circuit layers upon one of the series of semiconductor substrate wafers was then exposed to the plasma assisted etch process and the two-step plasma purge process of the second preferred embodiment of the present invention. The silicon oxide integrated circuit layers upon the other series of semiconductor substrate wafers were exposed to only the plasma assisted etch process of the second preferred embodiment of the present invention and not the two-step plasma purge process of the second preferred embodiment of the present invention. Each of the silicon oxide integrated circuit layers was re-measured to determine the level of surface contaminant particulate after the plasma assisted etch process. The results of these measurements are reported in TABLE I.

TABLE I

| Process Conditions | Particles Added per Wafer |
|---|---|
| Etch with Plasma Purge | 25 |
| Etch without Plasma Purge | 250 |

From the data of TABLE I it is seen that the two-step plasma purge process, when applied within the context of the second preferred embodiment of the present invention, provides an etched silicon oxide integrated circuit layer having fewer contaminant particles deposited upon its surface than an equivalently etched silicon oxide integrated circuit layer which has not benefitted from the two-step plasma purge process of the second preferred embodiment of the present invention.

As is understood by a person skilled in the art, the preferred embodiments and examples of the present invention are illustrative of the present invention rather than limiting of the present invention. Modifications and variations upon the methods and materials through which is practiced the preferred embodiments and examples of the present invention may yield additional embodiments and examples which are within the spirit and scope of the present invention.

What is claimed is:

1. A method for limiting contaminant particle deposition upon integrated circuit layers within plasma assisted process reactor chambers comprising:

undertaking a plasma assisted process upon an integrated circuit layer within a plasma assisted process reactor chamber, the plasma assisted process employing a first reactant gas composition, a first radio frequency power and a first reactor chamber pressure;

undertaking a first plasma purge step for a first purge time immediately following the plasma assisted process, the first plasma purge step employing a first concentration of an oxidizing reactant gas, a first concentration of a non-oxidizing reactant gas, a second radio frequency power and a second reactor chamber pressure, the second radio frequency power being lower than the first radio frequency power and the second reactor chamber pressure being higher than the first reactor chamber pressure;

undertaking a second plasma purge step for a second purge time immediately following the first plasma purge step, the second plasma purge step employing a second concentration of the oxidizing reactant gas, a second concentration of the non-oxidizing reactant gas, a third radio frequency power and a third reactor chamber pressure, the third radio frequency power being less than the second radio frequency power, and the third reactor chamber pressure being lower than the second reactor chamber pressure.

2. A method for limiting contaminant particle deposition upon silicon oxide integrated circuit layers deposited within plasma assisted process reactor chambers comprising:

depositing through a plasma assisted process a silicon oxide integrated circuit layer within a plasma assisted process reactor chamber, the plasma assisted process employing a first reactant gas composition, a first radio frequency power and a first reactor chamber pressure;

undertaking a first plasma purge step for a first purge time immediately following the plasma assisted process, the first plasma purge step employing a first concentration of an oxidizing reactant gas, a first concentration of a non-oxidizing reactant gas, a second radio frequency power and a second reactor chamber pressure, the second radio frequency power being lower than the first radio frequency power and the second reactor chamber pressure being higher than the first reactor chamber pressure;

undertaking a second plasma purge step for a second purge time immediately following the first plasma purge step, the second plasma purge step employing a second concentration of the oxidizing reactant gas, a second concentration of the non-oxidizing reactant gas, a third radio frequency power and a third reactor chamber pressure, the third radio frequency power being less than the second radio frequency power, and the third reactor chamber pressure being lower than the second reactor chamber pressure.

3. The method of claim 1 wherein the integrated circuit layer is chosen from the group of integrated circuit layers consisting of integrated circuit conductor layers, integrated circuit insulator layers, integrated circuit semiconductor layers and integrated circuit photo-active layers.

4. The method of claim 1 wherein the first radio frequency power is from about 200 to about 950 watts and the first reactor chamber pressure is from about 200 to about 3000 mTorr.

5. The method of claim 1 wherein the first purge time is from about 5 to about 15 seconds.

6. The method of claim 1 wherein the second radio frequency power is from about 25 to about 50 percent of the first radio frequency power and the second reactor chamber pressure is from about 200 to about 400 percent the first reactor chamber pressure.

7. The method of claim 1 wherein the oxidizing reactant gas is oxygen and the non-oxidizing reactant gas is argon.

8. The method of claim 7 wherein the first concentration of oxidizing reactant gas is from about 80 to about 500 sccm and the first concentration of non-oxidizing reactant gas is from about 100 to about 500 sccm.

9. The method of claim 1 wherein the second purge time is from about 5 to about 15 seconds.

10. The method of claim 1 wherein the third radio frequency power is from about 20 to about 50 percent of the second radio frequency power and the third reactor chamber pressure is no greater than about 50 percent of the second reactor chamber pressure.

11. The method of claim 7 wherein the second concentration of oxidizing reactant gas is from about 80 to about 500 sccm and the second concentration of non-oxidizing reactant gas is from about 100 to about 500 sccm.

12. The method of claim 1 further comprising a magnetic assistance to the plasma assisted process.

13. The methodof claim 12 wherein the magnetic assistance is provided at about 20 to about 100 gauss.

14. A method for limiting contaminant particle deposition upon silicon oxide integrated circuit layers etched within plasma assisted process reactor chambers comprising:

etching through a plasma assisted process a silicon oxide integrated circuit layer within a plasma assisted process reactor chamber, the plasma assisted process employing a first reactant gas composition, a first radio frequency power and a first reactor chamber pressure;

undertaking a first plasma purge step for a first purge time immediately following the plasma assisted process, the first plasma purge step employing a first concentration of an oxidizing reactant gas, a first concentration of a non-oxidizing reactant gas, a second radio frequency power and a second reactor chamber pressure, the second radio frequency power being lower than the first radio frequency power and the second reactor chamber pressure being higher than the first reactor chamber pressure;

undertaking a second plasma purge step for a second purge time immediately following the first plasma purge step, the second plasma purge step employing a second concentration of the oxidizing reactant gas, a second concentration of the non-oxidizing reactant gas, a third radio frequency power and a third reactor chamber pressure, the third radio frequency power being less than the second radio frequency power, and the third reactor chamber pressure being lower than the second reactor chamber pressure.

15. The method of claim 14 wherein:

the first radio frequency power is from about 600 to about 950 watts;

the first reactor chamber pressure is from about 200 to about 300 mTorr; and the first reactant gas composition is comprised of tri-fluoro-methane at about 10 to about 100 standard cubic centimeters per minute (sccm), carbon-tetra-fluoride at about 65 to about 95 standard cubic centimeters per minute (sccm) and argon at about 40 to about 80 standard cubic centimeters per minute (sccm).

16. The method of claim 14 wherein:

the first concentration of oxidizing reactant gas is comprised of oxygen at about 80 to about 150 sccm;

the first concentration of non-oxidizing reactant gas is comprised of argon at about 100 to about 200 sccm;

the second radio frequency power is from about 250 to about 350 watts; and the second reactor chamber pressure is from about 400 to about 900 mTorr.

17. The method of claim 14 wherein:

the second concentration of oxidizing reactant gas is comprised of oxygen at about 80 to about 150 sccm;

the second concentration of non-oxidizing reactant gas is comprised of argon at about 100 to about 200 sccm;

the third radio frequency power is from about 50 to about 150 watts; and the third reactor chamber pressure is no greater than about 200 mTorr.

18. The method of claim 14 further comprising a magnetic assistance to the plasma assisted etch process, the first plasma purge step and the second plasma purge step, the magnetic assistance being provided at a magnetic field strength of about 20 to about 100 gauss.

19. The method of claim 2 wherein:

the second concentration of oxidizing reactant gas is comprised of oxygen at about 100 to about 500 sccm;

the second concentration of non-oxidizing reactant gas is comprised of argon at about 10 to about 500 sccm;

the third radio frequency power is from about 20 to about 150 watts; and the third reactor chamber pressure is no greater than about 500 mTorr.

20. The method of claim 2 wherein:

the first radio frequency power is from about 200 to about 700 watts;

the first reactor chamber pressure is from about 500 to about 3000 mTorr; and the first reactant gas composition is comprised of Tetra Ethyl Ortho Silicate (TEOS) at about 100 to about 600 standard cubic centimeters per minute (sccm).

21. The method of claim 2 wherein:

the first concentration of oxidizing reactant gas is comprised of oxygen at about 100 to about 500 sccm;

the first concentration of non-oxidizing reactant gas is comprised of argon at about 100 to about 500 sccm;

the second radio frequency power is from about 50 to about 300 watts; and the second reactor chamber pressure is from about 2000 to about 7000 mTorr.

* * * * *